United States Patent
Turan et al.

(10) Patent No.: US 12,327,749 B2
(45) Date of Patent: Jun. 10, 2025

(54) CARRIER CHUCK AND METHODS OF FORMING AND USING THEREOF

(71) Applicant: Intel Corporation, Santa Clara, CA (US)

(72) Inventors: Deniz Turan, Chandler, AZ (US); Yosef Kornbluth, Phoenix, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 17/949,258

(22) Filed: Sep. 21, 2022

(65) Prior Publication Data
US 2024/0096678 A1    Mar. 21, 2024

(51) Int. Cl.
*H01L 21/683* (2006.01)
*H01L 21/677* (2006.01)

(52) U.S. Cl.
CPC .... *H01L 21/6833* (2013.01); *H01L 21/67781* (2013.01)

(58) Field of Classification Search
CPC ............ H01L 21/6833; H01L 21/67781
See application file for complete search history.

(56) References Cited

U.S. PATENT DOCUMENTS

| | | | | |
|---|---|---|---|---|
| 4,962,441 A | * | 10/1990 | Collins | H02N 13/00 361/234 |
| 5,751,537 A | * | 5/1998 | Kumar | H02N 13/00 340/638 |
| 5,969,934 A | * | 10/1999 | Larsen | H02N 13/00 361/234 |
| 2006/0110620 A1 | * | 5/2006 | Lin | B32B 15/01 428/650 |
| 2008/0037194 A1 | * | 2/2008 | Kamitani | H01L 21/683 361/234 |
| 2016/0196997 A1 | * | 7/2016 | White | H01L 21/6833 |
| 2022/0199451 A1 | * | 6/2022 | Lee | H01L 21/6833 |

* cited by examiner

*Primary Examiner* — Jared Fureman
*Assistant Examiner* — Samantha L Faubert
(74) *Attorney, Agent, or Firm* — Viering, Jentschura & Partner mbB

(57) ABSTRACT

The present disclosure is directed to a carrier chuck having a base plate with a top surface, at least one electrode positioned in a first carrier region of the top surface and configured to produce an electrostatic force to retain a panel placed on the carrier chuck during panel processing, and a dielectric layer positioned over the at least one electrode. The at least one electrode extends from the top surface by a height of at least 20 um.

20 Claims, 7 Drawing Sheets

CARRIER CHUCK AND METHODS OF FORMING AND USING THEREOF

BACKGROUND

In semiconductor panel fabrication, some panels, such as Omni-Directional Interconnect (ODI) panels, may be built on glass carriers, with the use of a temporary bonding layer. The panels may then be debonded or separated from the glass carriers on which they are built, resulting in post-debonded panels which are smaller (e.g., 505 mm×500 mm) than standard panel dimensions. A post-debonded panel is the remaining panel after the chemical bond between the panel and glass carrier has been broken. In other words, the above-mentioned bonding layer is broken, and the resulting panel becomes slightly smaller than the glass carrier. This difference in size will exist for panel handling/processing at multiple tools since almost all such tools are designed or scoped to process panels of a standard size (e.g., 510 mm×515 mm). An intermediary device may be needed to ease handling of such panels with dimensions that are different from standard panel dimensions during processing and transfer between processing tools.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
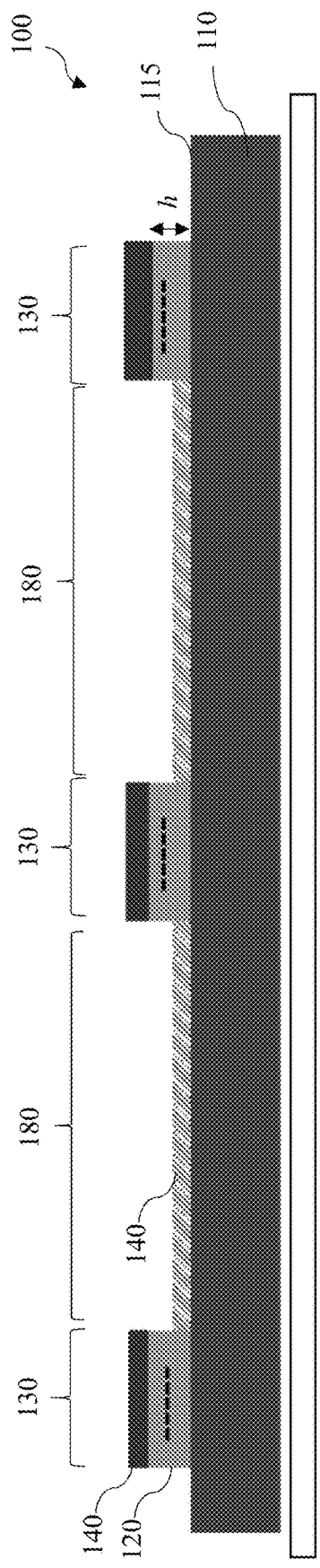
FIGS. 1A and 1B show simplified cross-section views of an exemplary carrier chuck according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Various aspects of the present disclosure provide a carrier chuck. The carrier chuck may be used for facilitating the handling of a panel for processing. The carrier chuck may include a base plate with a top surface. One or more electrodes may be positioned in a first carrier region of the top surface and configured to produce an electrostatic force to retain a panel placed on the carrier chuck during panel processing. The electrodes may extend from the top surface by a height of at least 20 um. A dielectric layer may be positioned over the electrodes. The dielectric layer serves as a passivation layer for the electrodes.

The first carrier region may correspond to at least a part of keep out zones on the panel. A keep out zone may be a designated area or region of the panel where device features or other circuitry are not placed. For example, a keep out zone may be a dedicated area for panel handling.

As discussed above, some panels may be formed through the use of a glass carrier. For example, a panel may include a plurality of layers, including dielectrics and conductors that are sequentially bonded to the glass carrier. The panel may include dies, i.e., already-formed electronic components, that are embedded in that plurality of levels. The newly formed panel with the plurality of levels is then debonded from the glass carrier to produce a debonded panel. For example, the debonded panel may be an Omni-Directional Interconnect (ODI) panel. Other types of panel may also be formed in the same manner (e.g., built on a temporary glass carrier and subsequently debonded from the glass carrier). A panel, such as the above-mentioned debonded panel, may have a dimension smaller than the standard dimensions of panels. For example, the standard dimensions of panels may be about 510 mm×515 mm, while the debonded smaller panel may have a dimension of about 505 mm×500 mm.

In various aspects, the carrier chuck may be advantageously used as a temporary carrier for handling a panel, for example, having a dimension that is different (e.g., smaller) from the standard dimensions of panels, without the need to change the handling mechanisms on available existing tools and/or without requiring new tools to process the smaller panel. The electrodes may be elevated from the top surface of the base plate to reduce or prevent contact between device feature(s) on the panel and the base plate.

The keep out zones (or KOZ regions) on the panel may be arranged to ensure safe handling and transportation of the panels (e.g., without damaging the panels and/or damaging any electronic components on the panels) or to ensure certain processes are performed reliably such as singulation processes. The electrodes of the carrier chuck may be configured based on the keep out zones of the panels to be handled, which simplifies the chucking procedure. The electrodes may be arranged or positioned in locations of the carrier chuck/temporary carrier that matches with the keep out zones of the panel. By providing the electrodes positioned in the first carrier region corresponding to at least a part of the keep out zones on the panel, an electrostatic force may be applied only to certain locations on the panel. In this regard, various aspects enable the electrostatic force to be applied only on the keep out zones on the panel.

The panel may further include one or more device features, such as solder bumps. The panel may include a first panel surface on which the solder bumps may be disposed or attached. The first panel surface may be facing the top surface of the base plate when the panel and carrier chuck are electrostatically bonded. In this regard, the panel and carrier chuck may be temporarily bonded until the electrostatic force is absent.

In another aspect, the electrodes may be positioned at a predetermined height from the top surface of the base plate to provide space to accommodate one or more device features on the panel when the panel is placed on the carrier chuck. The electrodes may be elevated from a surface of the carrier chuck (e.g., the top surface of the base plate) enough to prevent contact between the device features and the carrier chuck.

In another aspect, the top surface of the base plate further includes a second carrier region for accommodating one or more device features on the panel. The device features, for example, may be or include, solder bumps, assembled electronic components (e.g., silicon dies, discrete capacitors, etc). Accordingly, a dedicated region (i.e., a first carrier region) of the top surface of the base plate on which electrode(s) are positioned may be configured specifically for producing an electrostatic force with the keep out zones of the panel, while another dedicated region (i.e., a second carrier region) of the top surface of the base plate may be configured specifically for interfacing with regions of the panel that contain device features. Various aspects provide a carrier chuck that is compatible with panels with dies and solder bumps (e.g., microbumps). A technical advantage of the present disclosure includes protecting the embedded dies in the panel from electrical damage by preventing contact between the solder bumps and the electrodes by the use of the first and second carrier regions.

In another aspect, a dielectric layer may be further positioned over the second carrier region on the top surface of the present carrier chuck. The dielectric layer may serve as a passivation layer between the device features on a panel and the carrier chuck to protect the panel from any other unintended electrical discharge between the carrier chuck and the panel.

In another aspect, the present carrier chuck may include an electrostatic discharge (ESD) protective layer positioned on a dielectric layer formed as a passivation layer over the second carrier region. The ESD protective layer may have a breakdown voltage of about 3000 V to about 15000 V. The ESD protective layer may be a soft film with an elasticity of about 10 kPa to about 500 kPa.

In yet another aspect, the ESD protective layer may be positioned over the second carrier region of the top surface of the base plate. The ESD protective layer may contact the top surface of the base plate.

According to various aspects, when an ESD protective layer is used, mechanical damage on device features, such as solder bumps may be prevented because they are in contact with the soft ESD protective layer, rather than the harder surface of the base plate (i.e., the top surface).

To more readily understand and put into practical effect the present carrier chuck, which may be used for panel handling, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

Figure 1B:
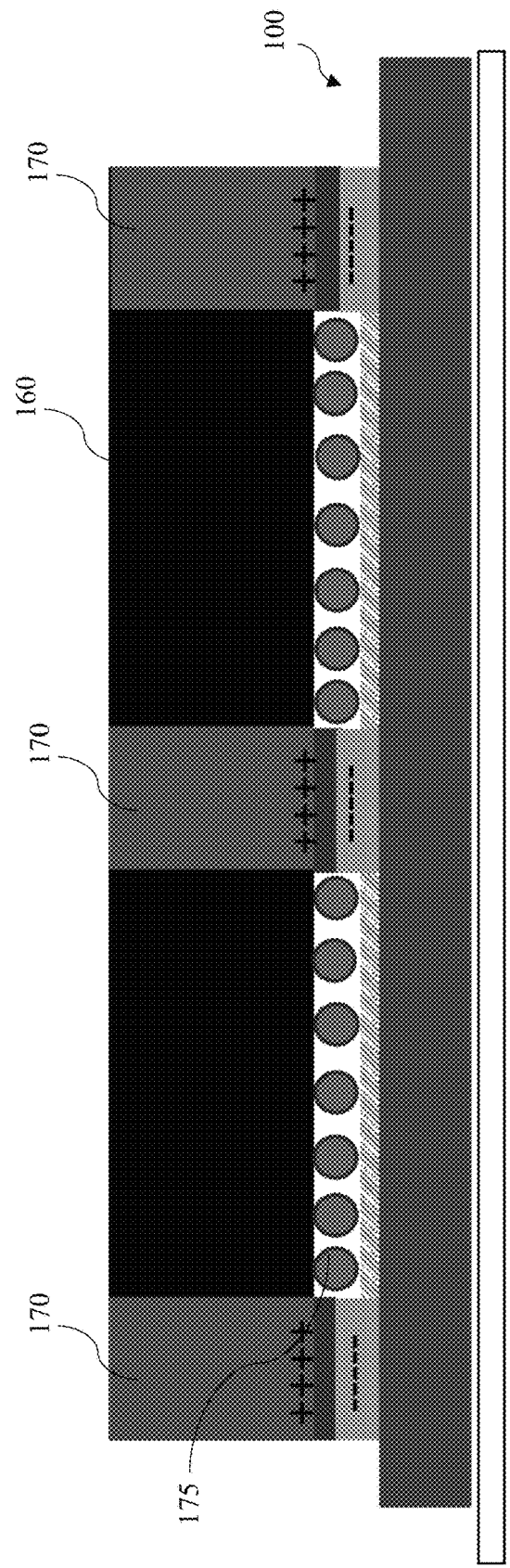

FIGS. 1A and 1B show a simplified cross-section view of an exemplary carrier chuck 100 according to an aspect of the present disclosure. The carrier chuck 100 includes a base plate 110 with a top surface 115. One or more electrodes 120 may be positioned in a first carrier region 130 of the top surface 115 and configured to produce an electrostatic force to retain a panel placed on the carrier chuck during panel processing. The one or more electrodes 120 may extend from the top surface 115 by a height h of at least 20 um. Accordingly, the one or more electrodes 120 may be elevated from the top surface 115 of the base plate 110. A dielectric layer 140 may be positioned over the one or more electrodes 120. FIG. 1B illustrates the carrier chuck 100 with a panel 160 placed on the carrier chuck 100. The first carrier region 130 may correspond to at least a part of keep out zones 170 on the panel 160. For example, the electrode(s) may cover (or overlap) only a part of the keep out zones. In other embodiments, the electrode(s) may fully cover or overlap the keep out zones. Accordingly, an electrostatic force may be applied from certain locations of the carrier chuck 100 on the panel 160. According to various aspects, the carrier chuck 100 may be used to produce an electrostatic force only on the keep out zones 170 on the panel 160. In other words, the one or more electrodes 120 of the carrier chuck 100 may be positioned on the base plate 110 to contact the panel 160 from the designated keep out zones 170 of the panel.

The one or more electrodes 120 may be positioned at a predetermined height h from the top surface 115 to provide space to accommodate one more device features, such as solder bumps 175 attached to the panel 160, when the panel 160 is placed on the carrier chuck 100. The predetermined height h may be sufficient to prevent the solder bumps 175 from contacting the top surface 115 of the base plate 110 when the panel is electrostatically bonded to the carrier chuck. According to various aspects, the predetermined height h may range from about 20 um to about 60 um from the top surface 115 of the base plate 110. The remaining areas or portions of the base plate 110 will be lower than the height of the one or more electrodes 120.

The base plate may further include a second carrier region 180 of the top surface 115 for accommodating one or more device features, such as a plurality of solder bumps 175 attached to the panel 160. The second carrier region 180 include areas or portions of the base plate 110 that do not have an electrode.

According to various aspects, the dielectric layer 140 may be further positioned over the second carrier region 180 on the top surface 115 of the base plate 110. In other words, the remaining areas or portions of the base plate 110 may be covered with a dielectric layer to protect the exposed solder bumps 175 which are attached to the panel 160. The dielectric layer 140 may serve as a passivation layer to minimize current from the electrodes outwards. The dielectric layer 140, for example, may be formed of polyimide, silicon dioxide or aluminum oxide.

Figure 2A:
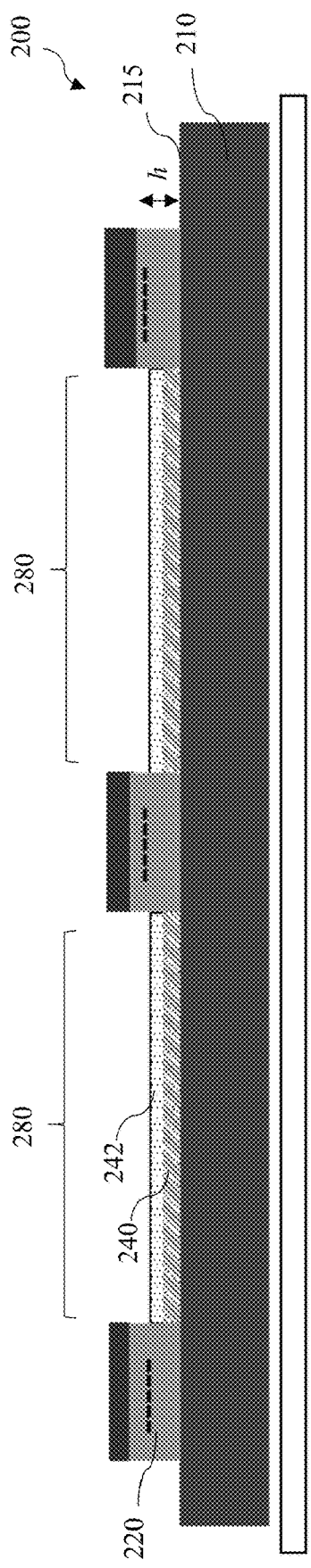
FIGS. 2A and 2B show simplified cross-section views of another exemplary carrier chuck according to an aspect of the present disclosure.
Figure 2B:
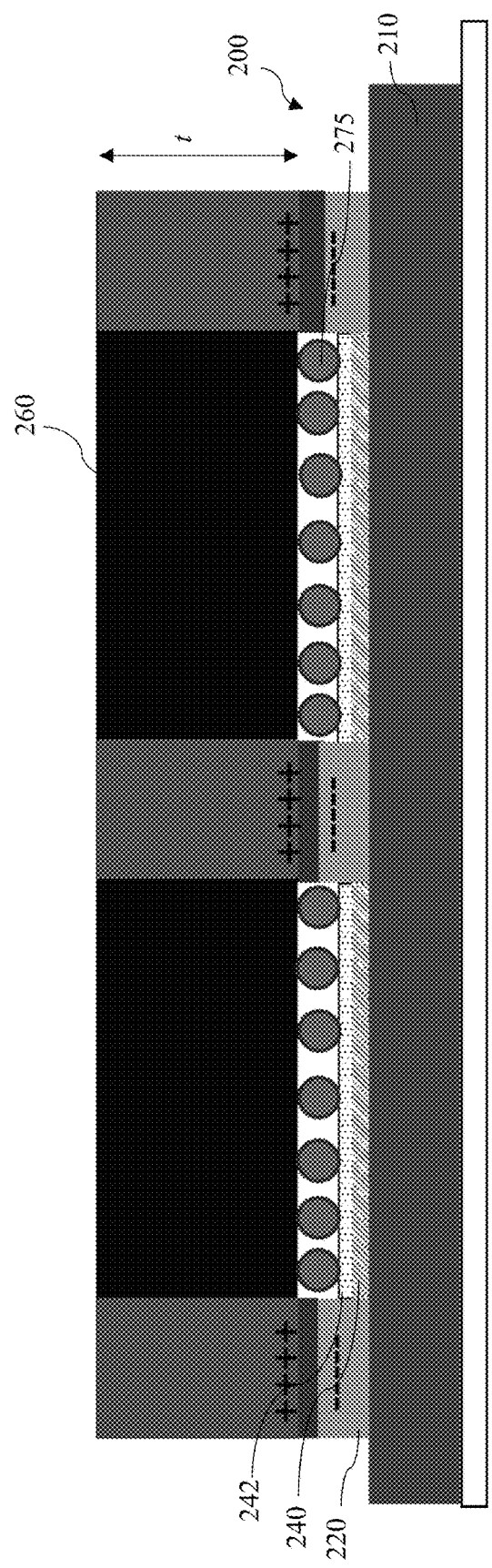

FIGS. 2A and 2B show a simplified cross-section view of another exemplary carrier chuck 200 according to an aspect of the present disclosure. In FIGS. 2A and 2B, according to various aspects, an electrostatic discharge (ESD) protective layer 242 may be positioned on a dielectric layer 240, which is positioned over the second carrier region 280. The ESD protective layer 242 may have a breakdown voltage of about 3000 V to about 15000 V. According to various aspects, the ESD protective layer 242 may have a breakdown voltage of 5 kV/mm or greater. The ESD protective layer 242 may be sufficient to prevent all measurable, even instantaneous, currents from damaging the sensitive electronics on the dies or chips in the panel. The ESD protective layer 242 may be a soft film. The ESD protective layer may have an elasticity of about 10 kPa to about 500 kPa. The ESD protective layer 242 may be compressible. The ESD protective layer 242 may be used to protect one or more device features, such as solder bumps 275, which are attached to the panel 260 mechanically and electrically. In a non-limiting example, the ESD protective layer may be a Kerafol 86/200 film, or any other film with a low Young's modulus under compression and high electrical breakdown voltage. Other types of ESD protective layer such as with a high loading of ceramics and/or polyimides may be used.

The solder bumps 275, for example, may be microbumps with a height of about 40 um. In the case that the solder bumps have a height of about 40 um, one or more electrodes 220 may be elevated from the top surface 215 at a height of more than 40 um to accommodate the solder bumps 275, the ESD protective layer 242 and the dielectric layer 240 in the second carrier region 280. The solder bumps 275 may have other heights in other embodiments. The carrier chuck may be configured to accommodate different heights of the solder bumps 275 by changing the predetermined height h of the electrode(s).

In other aspects, the ESD protective layer 242 may be positioned over the second carrier region 280 on the top surface 215 of the base plate 210. The ESD protective layer may directly contact the top surface of the base plate (not shown). The ESD protective layer 242 may reduce or prevent the risk of the embedded dies in the panel from being damaged through electrostatic discharge. Additionally, the ESD protective layer 242 may prevent the device features such as the solder bumps 275 (e.g., microbumps) on the panel from being damaged due to the high applied pressure as in conventional chucks while the panel is held on the chuck.

According to various aspects, the electrode(s) may include a first electrode with a ring configuration, the first electrode corresponding to a first keep out zone on a periphery of the panel. According to various aspects, the electrode(s) may further include a second electrode extending from a first side to a second side of the base plate, the second electrode corresponding to a second keep out zone extending across the center of the panel.

Figures 3A, 3B:
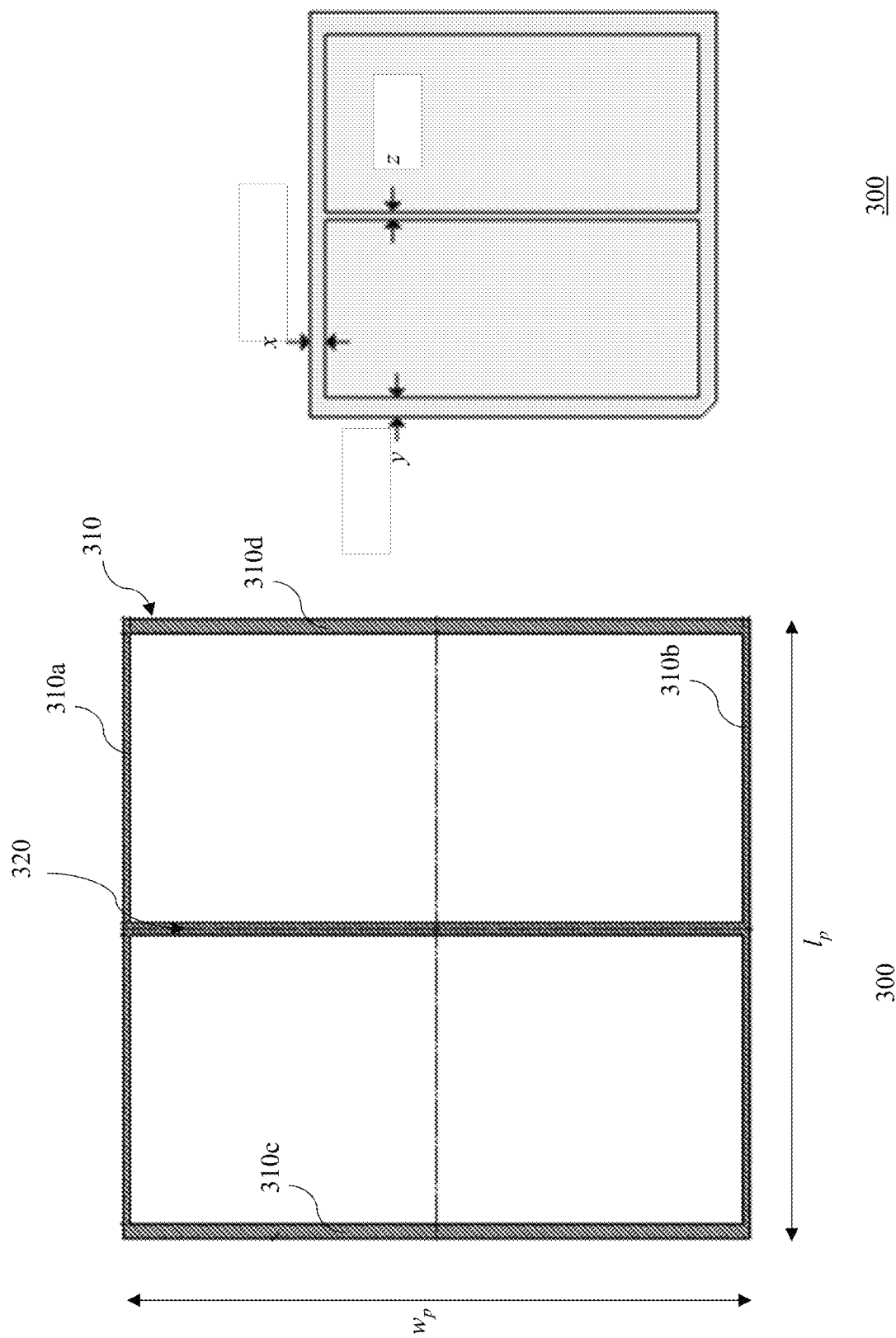
FIGS. 3A and 3B show top views of a panel according to an aspect of the present disclosure.

FIGS. 3A and 3B show top views of a panel 300 according to an aspect of the present disclosure. The panel 300 may be a post-debonded panel. For example, the panel 300 may have a length $l_p$ of about 500 mm and a width $w_p$ of about 505 mm (e.g., dimension of about 500 mm×505 mm). It is understood that other dimensions of the panel may also be used.

As illustrated, the panel 300 may have a first keep out zone 310 on a periphery of the panel and a second keep out zone 320 extending across a center of the panel. The first keep out zone 310 may be a continuous rectangle-shaped ring on the periphery of the panel. The first keep out zone 310 may have first and second opposing side portions 310a and 310b along the length of the panel and third and fourth opposing side portions 310c and 310d along the width of the panel. The first and second opposing side portions 310a and 310b may have a width x; for example, about 5.25 mm. The third and fourth opposing side portions 310c and 310d may have a width y; for example, about 11.4 mm. The second keep out zone 320 may be a continuous strip extending across a center of the panel. The second keep out zone 320 may be connected to the first keep out zone 310. The second keep out zone 320 may have a width z; for example, about 10 mm.

A total force applied on the panel 300 may be calculated when the electrostatic field is only applied from the KOZ region of the panel. Based on the configuration of the keep out zones of the panel 300, the total contact area, $A_c$, may be determined as follows:

$$A_c = (l_p \times w_p) - (l_p - 2y - z)(w_p - 2x)$$

Accordingly, $A_c = 505 \times 500 - 467.2 \times 494.5 = 2.147 \times 10^4$ mm$^2$-0.02147 m$^2$ The pressure offered by conventional electrostatic chucks is about 5 kPa. Based on this, the total force, F, applied on the panel 300 will be:

$$F = P \times A = 5 \times 10^3 \times 0.0217 = 0.107.348 \ N$$

F denotes the total force, P denotes the pressure, A denotes the contact area.

The force will be enough to hold the panel 300 firmly on the carrier chuck.

Although the panel 300 is illustrated to have a first keep out zone 310 on a periphery of the panel and a second keep out zone 320 extending across a center of the panel 300, it is understood that other configurations may also be used. For example, the panel 300 may have the first keep out zone 310 on the periphery of the panel 300 but not the second keep out zone extending across a center of the panel 300.

In other aspects, the panel 300 may have other configurations of keep out zones depending on where features are place, and what areas are useful for handling. For example, a plurality of relatively smaller keep out zones may be provided in the panel to aid in electrostatic bonding/debonding. For example, keep out zones may be added in small regions between units, which are in the interior of the panel. Electrostatic adhesion requires good bonding on the edges, and a reasonable amount of bonding on the center of the panel. Thus, the panel may include the keep out zones as described with respect to panel 300 combined with a plurality of small keep out zones (e.g., 1-4 mm width) where two or four units for example meet. For example, one hundred smaller keep out zones may be squeezed between units (10 mm$^2$ each in size), for 300 cm$^2$. The keep out zones may have a variety of shapes, including circles, rectangles, squares, or any other shapes, depending on where features are placed or positioned and/or how much space is available for the keep out zones. Accordingly, electrodes may be positioned on the base plate of the carrier chuck to correspond to the keep out zones so as to be compatible with other panel designs.

According to various aspects, a minimal contact area between the electrode(s) and keep out zones of the panel may be about 20 cm$^2$. For example, the keep out zones on a panel may be a plurality of strips (e.g., four strips), each with a dimension of about 50 cm×1 mm. Four electrode strips, each with a dimension of about 50 cm×1 mm may be provided to match the keep out zones on the panel.

The carrier chuck may be used to handle thin panels. Referring back to FIG. 2B, the panel, for example, may have a thickness t of about 0.2 mm to about 1.0 mm.

The base plate may be sized to support the panel which contains multiple dies.

The electrode design may be configured to take advantage of the long and narrow keep out zones. For example, interdigitated electrodes may be designed so that the edges of the keep out zones (open to air) are both electrode regions (rather than the space between electrodes).

Figure 4:
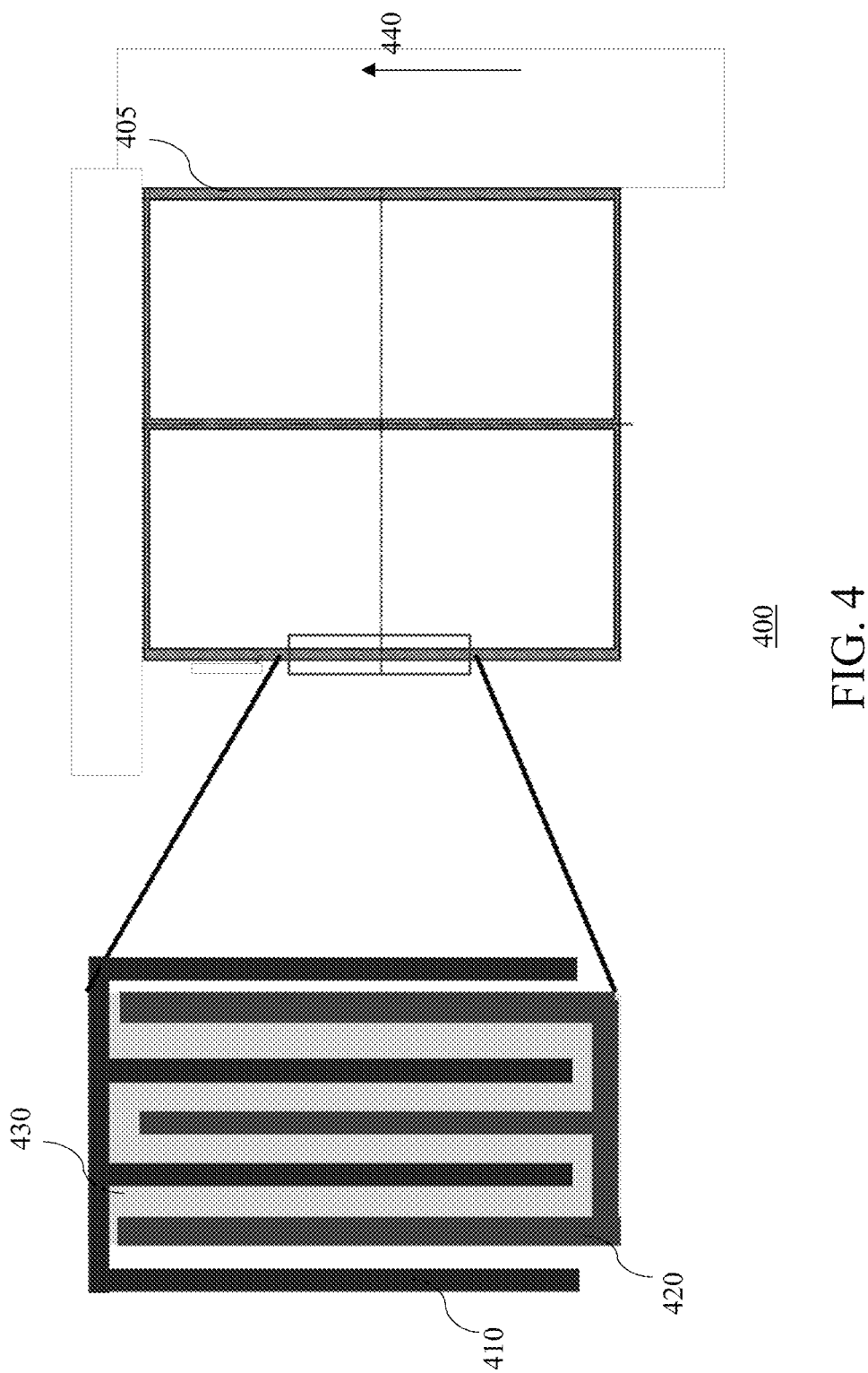
FIG. 4 shows a top view of an expanded portion of interdigitated electrodes of a carrier chuck corresponding to a portion of a panel according to an aspect of the present disclosure.

According to various aspects, the one or more electrodes 120 may include interdigitated electrodes configured as alternating lines carrying positive and negative charges. FIG. 4 shows a top view of an expanded portion 400 of the interdigitated electrodes of a carrier chuck corresponding to a portion of a panel 405 according to an aspect of the present disclosure. The interdigitated electrodes may include first electrode fingers 410 alternating with second electrode fingers 420. The first electrode fingers 410 may be configured to be coupled to a negative source or grounded and the second electrode fingers 420 may be configured to be coupled to a positive source. The second electrode fingers 420 may overlap with the keep out zones 430 when the panel is placed on the carrier chuck. For example, the interdigitated electrodes may cover (or overlap) only a part of the keep out zones. As illustrated, the panel 405 may be fed in a direction 440 into an equipment, such as an automated panel handler or a lithography tool.

Figure 5A:
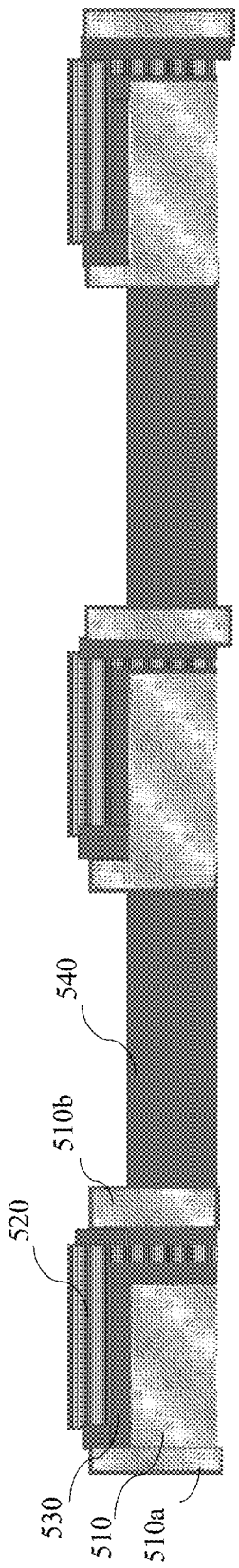
FIGS. 5A and 5B show simplified cross-section and top view, respectively, of another exemplary configuration of the electrodes of a carrier chuck according to an aspect of the present disclosure.
Figure 5B:
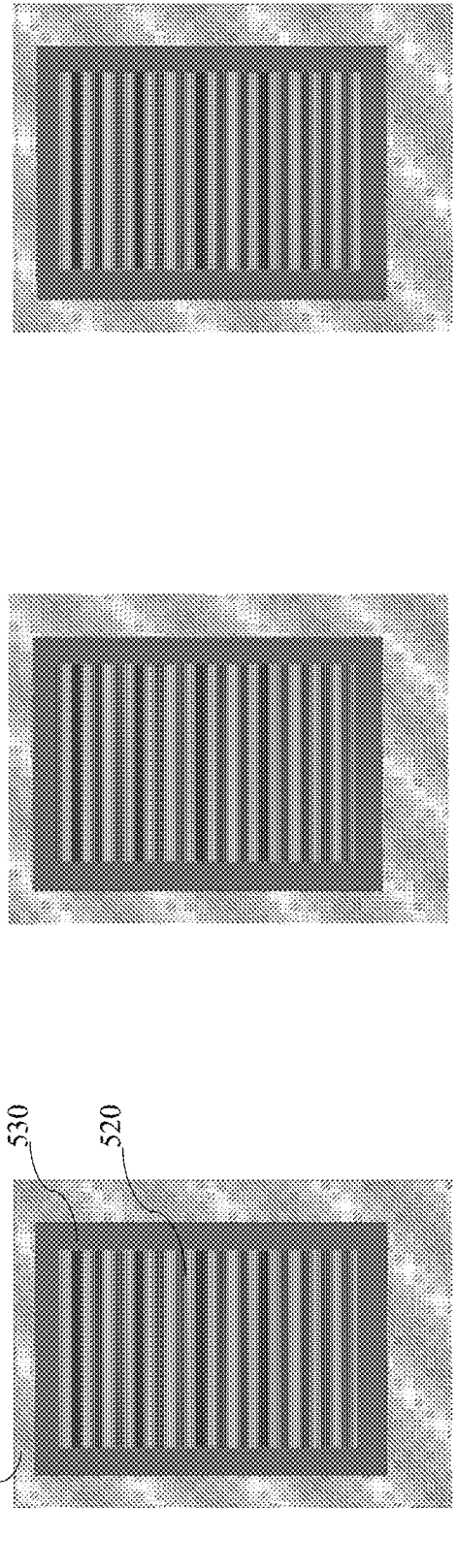

According to various aspects, the one or more electrodes 120 may include capacitive structures, such as one electrode directly above the other, with a voltage difference between them and an insulating layer between. This will maximize the charge of the ESD, using a design that is not feasible for large area electrodes. FIGS. 5A-5B show simplified cross-section and top views, respectively, of another exemplary configuration of the electrodes of the carrier chuck according to an aspect of the present disclosure. According to various aspects, the electrodes positioned in the first carrier region of the top surface of the base plate may include a first electrode 510 and a second electrode 520 arranged over the first electrode 510, and a dielectric layer 530 arranged between the first electrode 510 and the second electrode 520. The first electrode 510 may be configured to be coupled to a negative source or grounded and the second electrode 520 may be configured to be coupled to a positive source. The first electrode 510 (e.g., ground/negative electrode) may be configured to maximize the charge on the second electrode 520 (e.g., positive electrode); the closer the positive electrode is to a ground, the more charge (and electric field) may be produced. The first electrode 510 may include extended or coplanar portions 510a and 510b, (e.g., coplanar with respect to each other) to help shape the electrical field of the second electrode 520, making the electrical field of the second electrode 520 stronger. As illustrated in FIG. 5A, the extended portions 510a and 510b of the first electrode 510 are positioned to the side of the second electrode 520. For example, the first electrode 510 do not need to be in the keep out zone regions, i.e., do not need to match the keep out zones on the panel. The second electrode 520 may be positioned to cover and overlap the keep out zones when the panel is placed over the carrier chuck. Providing the second electrode 520 stacked over the first electrode 510 may maximize the charge produced and take advantage of the limited surface area of the keep out zones on the panel. An ESD protective layer 540 may be arranged in regions of the top surface of the base plate without electrodes.

Figure 6:
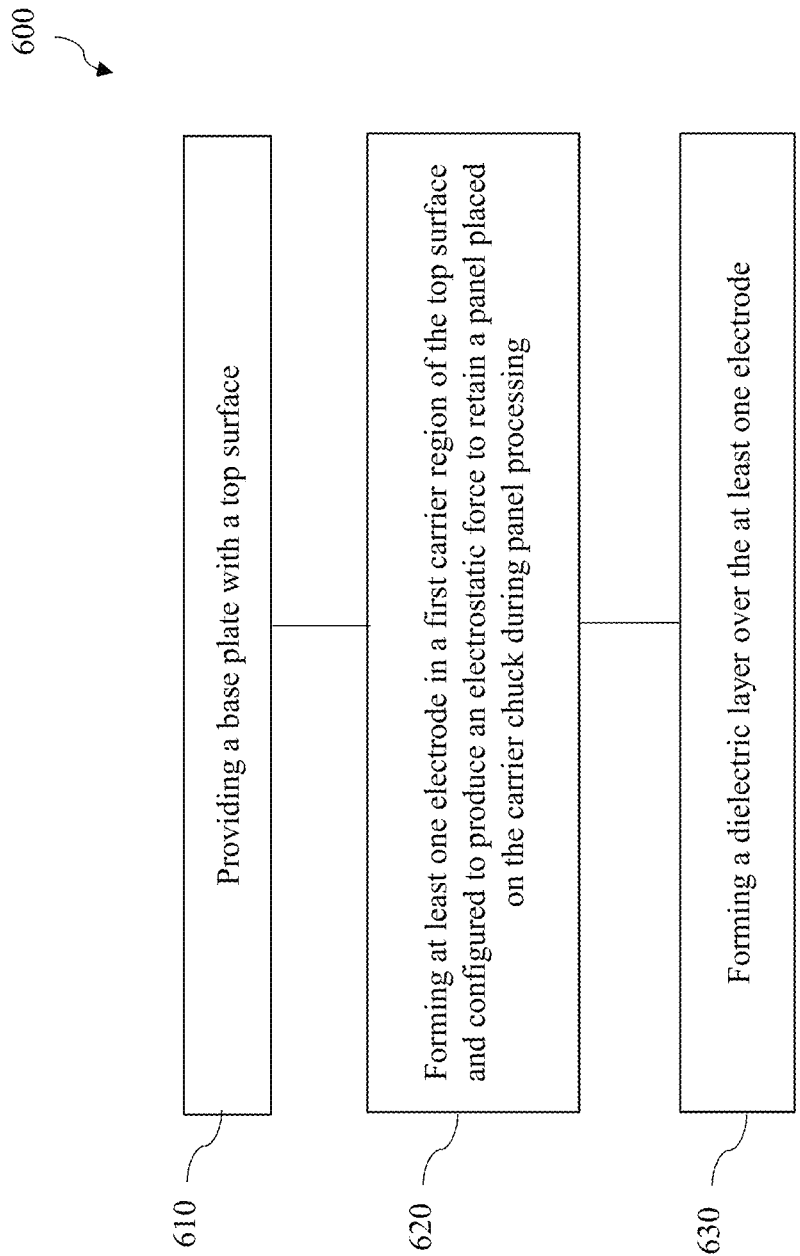
FIG. 6 shows an exemplary method according to an aspect of the present disclosure.

FIG. 6 shows an exemplary method 600 according to an aspect of the present disclosure. For example, the method 600 may be used for forming a carrier chuck according to various aspects. At 610, a base plate with a top surface may be provided. At 620, one or more electrodes may be formed in a first carrier region of the top surface and configured to produce an electrostatic force to retain a panel placed on the carrier chuck during panel processing. The electrodes may be formed to extend from the top surface by a height of at least 20 um. The first carrier region may correspond to at least a part of keep out zones on the panel. At 630, a dielectric layer may be formed over the electrodes.

The electrodes may be formed with a predetermined height from the top surface to provide space to accommodate one or more device features on the panel when the panel is placed on the carrier chuck.

The top surface of the base plate may further include a second carrier region for accommodating one or more device features on the panel, and the method further includes forming the dielectric layer over the second carrier region of the top surface.

Figure 7:
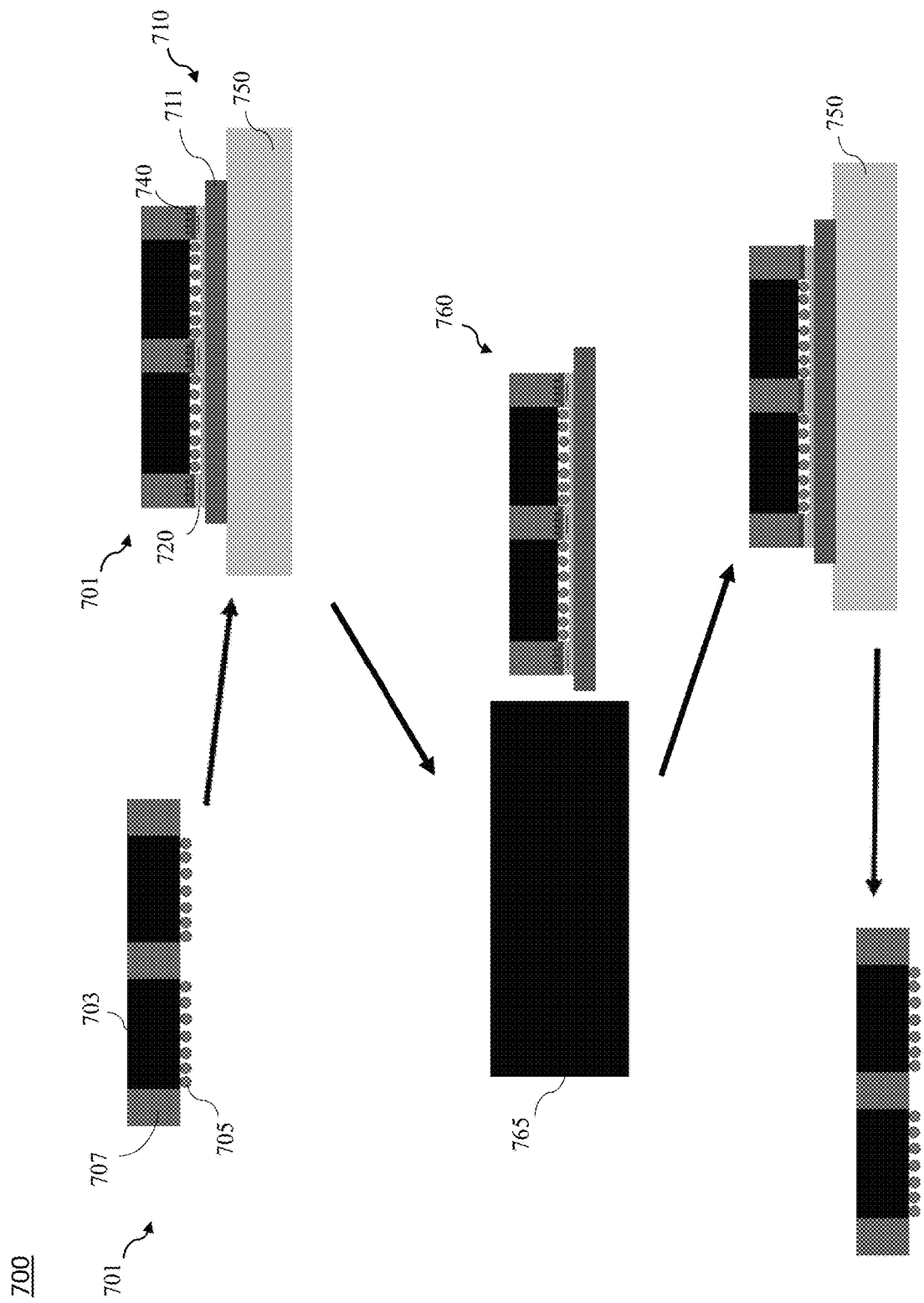
FIG. 7 shows another exemplary method according to an aspect of the present disclosure.

FIG. 7 shows another exemplary method 700 according to an aspect of the present disclosure. For example, the method 700 may be used for handling a panel for processing. As shown, a panel 701 may be provided. The panel 701 may contain embedded dies or components 703. The panel 701 may include solder bumps 705 attached to the panel 701. The panel 701 may include keep out zones 707 on the panel for panel handling.

A carrier chuck 710 may be provided. According to various aspects, the carrier chuck 710 may be used as a temporary carrier for the panel 701. The carrier chuck 710 may be an electrostatic carrier chuck. An electrostatic carrier chuck is a carrier that can firmly hold the object on it with electrostatic force. According to various aspects, the carrier chuck 710 may include a base plate 711 with a top surface, one or more electrodes 720 positioned in a first carrier region of the top surface and configured to produce an electrostatic force to retain the panel placed on the carrier chuck during panel processing, and a dielectric layer 740 positioned over the one or more electrodes 720. The electrodes 720 may extend from the top surface by a height of at least 20 um. The first carrier region may correspond to at least a part of the keep out zones 707 on the panel 701.

The panel 701 may be placed on the carrier chuck 710. The panel 701 may be positioned over the carrier chuck to align at least part of the keep out zones 707 on the panel to the one or more electrodes 720 in the first carrier region of the top surface.

The panel 701 may be electrostatically bonded (e.g., temporarily bonded) to the carrier chuck by an electrostatic force to form an electrostatically bonded panel 760. As illustrated in FIG. 7, the one or more electrodes 720 may be charged on a bonding station 750, which is similar to charging a capacitor. The excess charge created or produced on the one or more electrodes 720 will induce polarization on the panel 701, generating an electrostatic force between the panel 701 and the carrier chuck 710. The bonded panel 760 may be processed in one or more tools 765, such as lamination tools, lithography tools, etching tools, or planarization tools.

For debonding, the one or more electrodes 720 of the carrier chuck 710 may be discharged on the bonding station 750. The panel 701 may then be removed from the carrier chuck 710.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present carrier chuck configured to electrostatically hold or bond a panel with an electrostatic force, they will now be described by way of examples. For the sake of brevity, duplicate descriptions of features and properties may be omitted.

Examples

Example 1 provides a carrier chuck including a base plate with a top surface, at least one electrode positioned in a first carrier region of the top surface and configured to produce an electrostatic force to retain a panel placed on the carrier chuck during panel processing, and a dielectric layer positioned over the at least one electrode. The at least one electrode extends from the top surface by a height of at least 20 um.

Example 2 may include the carrier chuck of example 1 and/or any other example disclosed herein, for which the at least one electrode is positioned at a predetermined height from the top surface to provide space to accommodate one or more device features on the panel when the panel is placed on the carrier chuck.

Example 3 may include the carrier chuck of example 1 and/or any other example disclosed herein, for which the top surface of the base plate further comprises a second carrier region for accommodating one or more device features on the panel.

Example 4 may include the carrier chuck of example 3 and/or any other example disclosed herein, for which the dielectric layer is further positioned over the second carrier region of the top surface of the base plate.

Example 5 may include the carrier chuck of example 4 and/or any other example disclosed herein, further including an electrostatic discharge (ESD) protective layer positioned on the dielectric layer over the second carrier region, wherein the ESD protective layer has a breakdown voltage of about 3000 V to about 15000 V.

Example 6 may include the carrier chuck of example 5 and/or any other example disclosed herein, for which the ESD protective layer comprises an elasticity of about 10 kPa to about 500 kPa.

Example 7 may include the carrier chuck of example 3 and/or any other example disclosed herein, further including an ESD protective layer positioned over the second carrier region of the top surface of the base plate, the ESD protective layer contacts the top surface of the base plate, and in which the protective layer comprises an elasticity of about 10 kPa to about 500 kPa.

Example 8 may include the carrier chuck of example 1 and/or any other example disclosed herein, for which the at least one electrode comprises a first electrode with a ring configuration, the first electrode corresponding to a first keep out zone on a periphery of the panel.

Example 9 may include the carrier chuck of example 8 and/or any other example disclosed herein, for which the at least one electrode further comprises a second electrode extending from a first side to a second side of the base plate, the second electrode corresponding to a second keep out zone extending across a center of the panel.

Example 10 may include the carrier chuck of example 1 and/or any other example disclosed herein, for which the at least one electrode includes interdigitated electrodes configured as alternating lines carrying positive and negative charges.

Example 11 may include the carrier chuck of example 1 and/or any other example disclosed herein, for which the at least one electrode comprises a first electrode and a second electrode arranged over the first electrode, and a dielectric layer arranged between the first electrode and the second electrode.

Example 12 may include the carrier chuck of example 11 and/or any other example disclosed herein, for which the first electrode is configured to be coupled to a negative source or grounded and the second electrode is configured to be coupled to a positive source.

Example 13 may include the carrier chuck of example 1 and/or any other example disclosed herein, for which the base plate is sized to support the panel which contains multiple dies.

Example 14 provides a method including providing a base plate with a top surface, forming at least one electrode in a first carrier region of the top surface and configured to produce an electrostatic force to retain a panel placed on the carrier chuck during panel processing, and forming a dielectric layer over the at least one electrode. The at least one electrode may be formed to extend from the top surface by a height of at least 20 um.

Example 15 may include the method of example 14 and/or any other example disclosed herein, for which the at least one electrode is formed with a predetermined height from the top surface of the base plate to provide space to accommodate one or more device features on the panel when the panel is placed on the carrier chuck.

Example 16 may include the method of example 14 and/or any other example disclosed herein, for which the top surface of the base plate further includes a second carrier region for accommodating one or more device features on the panel, and the method further includes forming the dielectric layer over the second carrier region of the top surface.

Example 17 provides a method including providing a panel, providing a carrier chuck, the carrier chuck including a base plate with a top surface, at least one electrode positioned in a first carrier region of the top surface and configured to produce an electrostatic force to retain a panel placed on the carrier chuck during panel processing, and a dielectric layer positioned over the at least one electrode, in which the at least one electrode extends from the top surface by a height of at least 20 um, positioning the panel over the carrier chuck to align at least a part of keep out zones on the panel to the at least one electrode in the first carrier region of the top surface, electrostatically bonding the panel to the carrier chuck by an electrostatic force to produce an electrostatically bonded panel, and processing the bonded panel in one or more tools.

Example 18 may include the method of example 17 and/or any other example disclosed herein, for which the at least one electrode is positioned at a predetermined height from the top surface of the base plate to provide space to accommodate one or more device features on the panel when the panel is placed on the carrier chuck.

Example 19 may include the method of example 17 and/or any other example disclosed herein, for which bonding the panel to the carrier chuck includes placing the carrier chuck on a bonding station and charging the one or more electrodes to produce the electrostatic force between the panel and the carrier chuck.

Example 20 may include the method of example 17 and/or any other example disclosed herein, for which the top surface of the base plate further includes a second carrier region for accommodating one or more device features on the panel, and the dielectric layer is arranged over the second carrier region of the top surface.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A carrier chuck comprising:
  a base plate with a top surface;
  at least one electrode positioned in a first carrier region of the top surface and configured to be disposed proximally at a periphery of the base plate, wherein the at least one electrode is further configured to produce an electrostatic force at certain locations on a panel without device features to retain the panel placed on the carrier chuck during panel processing;
  a dielectric layer positioned over the at least one electrode;
  wherein the at least one electrode extends from the top surface of the base plate by a height of at least 20 μm to provide a first surface to engage the certain locations on the panel; and
  a second carrier region of the top surface, wherein the second carrier region is configured with a second surface below the first surface for accommodating one or more device features on the panel.

2. The carrier chuck of claim 1, wherein the at least one electrode is positioned at a predetermined height from the top surface to provide space to accommodate one or more device features on the panel when the panel is placed on the carrier chuck.

3. The carrier chuck of claim 1, wherein the certain locations comprise a first keep out zone having a substantially rectangular shape with a first side portion opposing a second side portion along a length of the panel and a third side portion opposing a fourth side portion along the width of the panel, wherein the first side portion and the second side portion are configured with a first width and the third side portion and the fourth are configured with a second width.

4. The carrier chuck of claim 1, wherein the dielectric layer is further positioned over the second carrier region of the top surface of the base plate.

5. The carrier chuck of claim 4, further comprising an electrostatic discharge (ESD) protective layer positioned on the dielectric layer over the second carrier region, wherein the ESD protective layer has a breakdown voltage of about 3000 V to about 15000 V.

6. The carrier chuck of claim 5, wherein the ESD protective layer comprises an elasticity of about 10 kPa to about 500 kPa.

7. The carrier chuck of claim 1, further comprising an ESD protective layer positioned over the second carrier region of the top surface of the base plate, the ESD protective layer contacts the top surface of the base plate, and wherein the protective layer comprises an elasticity of about 10 kPa to about 500 kPa.

8. The carrier chuck of claim 1, wherein the at least one electrode comprises a first electrode with a ring configuration, the first electrode corresponding to a first keep out zone on a periphery of the panel without device features.

9. The carrier chuck of claim 8, wherein the at least one electrode further comprises a second electrode extending from a first side to a second side of the base plate, the second electrode corresponding to a second keep out zone without device features extending across a center of the panel.

10. The carrier chuck of claim 1, wherein the at least one electrode comprises interdigitated electrodes configured as alternating lines carrying positive and negative charges.

11. The carrier chuck of claim 1, wherein the at least one electrode comprises a first electrode and a second electrode, wherein the second electrode is stacked over the first electrode, and the dielectric layer is arranged between the first electrode and the second electrode.

12. The carrier chuck of claim 11, wherein the first electrode is configured to be coupled to a negative source or grounded and the second electrode is configured to be coupled to a positive source.

13. The carrier chuck of claim 1, wherein the base plate is sized to support the panel which contains multiple dies.

14. A method comprising:
  providing a base plate with a top surface;
  forming at least one electrode in a first carrier region of the top surface and configured to be disposed proximally at a periphery of the base plate, wherein the at least one electrode is further configured to produce an electrostatic force at certain locations on a panel without device features to retain a panel placed on the carrier chuck during panel processing;
  forming a dielectric layer over the at least one electrode;
  wherein the at least one electrode is formed to extend from the top surface by a height of at least 20 μm to provide a first surface to engage the certain locations on the panel; and
  forming a second carrier region of the top surface, wherein the second carrier region is configured with a second surface below the first surface for accommodating one or more device features on the panel.

15. The method of claim 14, wherein the at least one electrode is formed with a predetermined height from the top surface of the base plate to provide space to accommodate one or more device features on the panel when the panel is placed on the carrier chuck.

16. The method of claim 14, further comprising forming the dielectric layer over the second carrier region of the top surface.

17. A method comprising:
  providing a panel;
  providing a carrier chuck, the carrier chuck comprising a base plate with a top surface, at least one electrode positioned in a first carrier region of the top surface and configured to be disposed proximally at a periphery of the base plate, wherein the at least one electrode is further configured to produce an electrostatic force to retain a panel having keep out zones without device features that is placed on the carrier chuck during panel processing, and a dielectric layer positioned over the at least one electrode, wherein the at least one electrode extends from the top surface by a height of at least 20 μm to provide a first surface to engage the keep out zones on the panel;

positioning the panel over the carrier chuck to align at least a part of the keep out zones on the panel with the at least one electrode in the first carrier region of the top surface;

electrostatically bonding the panel to the carrier chuck by an electrostatic force to produce an electrostatically bonded panel; and processing the bonded panel in one or more tools.

18. The method of claim 17, wherein the at least one electrode is positioned at a predetermined height from the top surface of the base plate to provide space to accommodate one or more device features on the panel when the panel is placed on the carrier chuck.

19. The method of claim 17, wherein bonding the panel to the carrier chuck comprises placing the carrier chuck on a bonding station and charging the at least one electrode to produce the electrostatic force between the panel and the carrier chuck.

20. The method of claim 17, wherein the top surface of the base plate further comprises a second carrier region configured with a second surface below the first surface for accommodating one or more device features on the panel, and the dielectric layer is further positioned over the second carrier region of the top surface.

* * * * *